(12) United States Patent
Endo et al.

(10) Patent No.: US 7,119,801 B1
(45) Date of Patent: Oct. 10, 2006

(54) DISPLAY DEVICE AND ELECTRONIC APPARATUS

(75) Inventors: Kogo Endo, Chino (JP); Eiji Oishi, Shimosuwa-machi (JP); Yasuhito Aruga, Okaya (JP)

(73) Assignee: Seiko Epson Corporation, (JP)

( * ) Notice: Subject to any disclaimer, the term of this patent is extended or adjusted under 35 U.S.C. 154(b) by 0 days.

(21) Appl. No.: 09/532,352

(22) Filed: Mar. 21, 2000

(30) Foreign Application Priority Data

Mar. 26, 1999 (JP) ................... 11-084769

(51) Int. Cl.
G09G 5/00 (2006.01)

(52) U.S. Cl. ........................................ 345/204; 345/87
(58) Field of Classification Search ................. 345/84, 345/85, 86, 87, 204, 205, 206, 90, 98, 100
See application file for complete search history.

(56) References Cited

U.S. PATENT DOCUMENTS

| | | | | |
|---|---|---|---|---|
| 4,379,621 A | * | 4/1983 | Ikedo et al. ................. | 348/795 |
| 5,241,454 A | | 8/1993 | Ameen et al. | |
| 5,467,210 A | * | 11/1995 | Kishigami ................... | 349/150 |
| 5,670,994 A | | 9/1997 | Kawaguchi et al. | |
| 5,712,493 A | | 1/1998 | Mori et al. | |
| 5,728,591 A | * | 3/1998 | Takahashi et al. ............. | 438/27 |
| 5,777,610 A | * | 7/1998 | Sugimoto et al. ........... | 345/206 |
| 5,841,414 A | | 11/1998 | Tanaka | |
| 6,067,062 A | * | 5/2000 | Takasu et al. ................. | 345/87 |
| 6,151,091 A | * | 11/2000 | Muramatsu .................. | 349/149 |

FOREIGN PATENT DOCUMENTS

| | | |
|---|---|---|
| JP | 59231518 | 12/1984 |
| JP | 1-259395 | 10/1989 |
| JP | 02-102769 U | 5/1990 |
| JP | 03-155184 | 7/1991 |
| JP | 4-33077 | 3/1992 |
| JP | 05224224 | 9/1993 |
| JP | 5-259648 | 10/1993 |
| JP | 05303109 | 11/1993 |
| JP | 6-235929 | 8/1994 |
| JP | 08-078954 | 3/1996 |
| JP | 8-262467 | 10/1996 |
| JP | 9-62199 | 3/1997 |
| JP | 09120079 | 5/1997 |
| JP | 11-24097 A | 1/1999 |

OTHER PUBLICATIONS

Korean Examination Result in counterpart application citing above documents.
Japanese Patent Office Examination Result in the corresponding Japanese Application No. 11-084769.

(Continued)

*Primary Examiner*—Richard Hjerpe
*Assistant Examiner*—Jean Lesperance
(74) *Attorney, Agent, or Firm*—Harness, Dickey & Pierce, P.L.C.

(57) ABSTRACT

A display device includes a display panel having an electrooptic material provided between a pair of substrates opposed to each other. The display panel has a driver integrated circuit mounted on an extended area in which an edge of one of the substrates extends further than an edge of the other substrate. The extended area is provided in at least a margin of the display panel. A control circuit board is provided above the driver integrated circuit almost within the extended area. The control circuit board is connected to the input terminal portion of the driver integrated circuit.

10 Claims, 7 Drawing Sheets

OTHER PUBLICATIONS

Communication from Japanese Patent Office re: counterpart application.

Communication from Japanese Patent Office regarding counterpart application.

Communication from European Patent Office regarding counterpart application.

Korean Examination Result in counterpart application citing above documents.

* cited by examiner

DISPLAY DEVICE AND ELECTRONIC APPARATUS

BACKGROUND OF THE INVENTION

1. Field of the Invention

The present invention relates to flat-panel display devices such as liquid-crystal display devices. The present invention also relates to electronic apparatus comprising the display device.

2. Description of the Related Art

Recently, display devices have been widely used as information-display terminals for portable apparatuses, home use, offices, factories, automobiles, etc. In particular, liquid-crystal display devices are characterized in that they are thin and light and that they use a low voltage and consume low power. Accordingly, liquid-crystal display devices are the main electronic displays in the present and in the future. Liquid-crystal display devices are being increasingly used in personal digital assistants, etc., which take advantage of their low-consumption-power characteristics.

As shown in FIG. 7, an example of conventional liquid-crystal display devices is a passive-matrix liquid-crystal display device or an active-matrix-liquid-crystal display device 1 that uses, as switching devices, two-terminal non-linear devices such as thin film diodes (TFDs). The liquid-crystal display device 1 generally includes a liquid-crystal display panel 2 and a printed-circuit board 3. The liquid-crystal display panel 2 and the printed-circuit board 3 are electrically connected via two flexible printed-wiring boards 4 and 5.

The liquid-crystal display panel 2 has a pair of glass substrates 6 and 7 disposed opposite to each other. The glass substrates 6 and 7 have liquid crystal sealed therebetween. On the opposed internal surface of the glass substrate 6, a plurality of signal electrodes 8 are formed in parallel with one another. On the opposed internal surface of the glass substrate 7, a plurality of scanning electrodes 9 are formed perpendicularly to the signal electrodes 8.

In a predetermined margin (the lower side in FIG. 7) of the liquid-crystal display panel 2, an edge of the glass substrate 6 extends (the bottom in FIG. 7) further than an edge of the glass substrate 7. In a margin (the left side in FIG. 7) of the liquid-crystal display panel 2 which is adjacent to the predetermined margin, an edge of the glass substrate 7 extends further than an edge of the glass substrate 6. In an extended area 6A on the opposed internal surface of the glass substrate 6, data-signal driver integrated circuits (ICs) 10 and 11 are mounted by chip-on-glass (COG) mounting. These data-signal-driver ICs 10 and 11 are connected to output terminals 8A formed by extending the plurality of signal electrodes 8 and to input terminals 12 provided at an edge of the extended area 6A. In an extended area 7A on the opposed internal surface of the glass substrate 7, a scanning driver IC 13 is mounted by COG. The scanning driver IC 13 is connected to output terminals 9A formed by extending the scanning electrodes 9 and to input terminals 14 provided in an edge of the extended area 7A.

The output terminals 4A of the flexible printed-wiring board 4 are bonded so as to be electrically connected to the input terminals 12, which are provided along the longer side of the extended area 6A of the glass substrate 6. Similarly, the output terminals 5A of the flexible printed-wiring board 5 are bonded so as to be electrically connected to the input terminals 14, which are provided along the longer side of the extended area 7A of the glass substrate 7. The input terminal portion 4B of the flexible printed-wiring board 4 is joined to an output terminal portion 15 formed on the printed-circuit board 3 as a control circuit board. The input terminal portion 5B of the flexible printed-wiring board 5 is joined to an output terminal portion 16 formed on the printed-circuit board 3. On the printed-circuit board 3, a predetermined wiring arrangement is formed, and various electronic components for controlling and driving the liquid-crystal display panel 2 are mounted.

One of electronic apparatuses using a liquid-crystal display device having the above-described structure includes input devices such as a key board or a ten-key pad, and uses a liquid-crystal display panel to display data in accordance with input operations from the input devices. In this electronics apparatus, the liquid-crystal display panel and a printed-circuit board are built in a chassis (panel accommodating frame). In this construction, two flexible printed-wiring boards are bent so that the printed-circuit board is positioned behind the liquid-crystal display panel.

In the above-described liquid-crystal display device, as shown in FIG. 8, the printed-circuit board 3 as a control circuit board is provided on the back surface of the liquid-crystal display panel 2. Thus, an overall thickness of the liquid-crystal display device increases and so does a thickness of the display unit for the electronic apparatus. Accordingly, the printed-circuit board 3 hinders thickness and weight reduction of the liquid-crystal display device and the electronic apparatus. In cellular telephones and portable information apparatuses such as portability-emphasized, pocket-sized personal computers, casing thickness must be reduced to its minimum. This problem, in which a control-circuit board hinders the casing thickness from being reduced, occurs not only in a passive-matrix liquid-crystal display device and an active-matrix liquid-crystal display device using the above-described two-terminal non-linear devices but also in various display devices such as an active-matrix liquid-crystal display device having a thin film transistor at each pixel, and an electroluminescent display device. For portability and mobility, it is required that various display devices including a liquid-crystal display device be reduced in weight and thickness. With this requirement, electronic components for driving a display are difficult to mount at high density in limited size and weight.

As shown in FIG. 7, in the above-described liquid-crystal display device 1, the flexible printed-wiring board 4 to be bonded to the extended area 6A of the glass substrate 6 on which the data-signal driver ICs 10 and 11 are mounted, and the flexible printed-wiring board 5 to be bonded to the extended area 7A of the glass substrate 7 on which the scanning driver IC 13 is mounted, must be separately bonded to the printed-circuit board 3. This complicates a modularizing step, and causes a lack of convenience. In addition, since the flexible printed-wiring boards 4 and 5 must be separately bonded to the printed-circuit board 3, it is not preferable that the output terminal portions 15 and 16 formed on the printed-circuit board 3 are too close to each other. In other words, when the flexible printed-wiring boards 4 and 5 are bonded to the printed-circuit board 3 by using a mounting apparatus, a distance preventing the flexible printed-wiring boards 4 and from interfering with each other must be provided. In this construction, the use of a plurality of (two) flexible printed-wiring boards 4 and 5 hinders the size reduction of the printed-circuit board 3.

An input-wiring means 17 for inputting control signals must be connected additionally to the printed-circuit board 3. This complicates terminal connection processing.

SUMMARY OF THE INVENTION

Accordingly, it is an object of the present invention to provide a display device and an electronic apparatus that are light and thin and that have simplified terminal-connection processing.

To this end, according to an aspect of the present invention, the foregoing object is achieved through provision of a display device provided with a display panel having an electrooptic material provided between a pair of substrates opposed to each other, the display panel having a driver integrated circuit mounted on an extended area in which an edge of one of the substrates extends further than an edge of the other substrate, the extended area provided in at least a margin of the display panel, wherein a control circuit board, provided above the driver integrated circuit so as to be substantially placed within the extended area, is connected to the input terminal portion of the driver integrated circuit.

In the present invention based on this construction, a driver IC is mounted on a step formed in an extended area in which an edge of one substrate extends further than an edge of the other substrate, in other words, on a step formed between the other substrate and the one substrate, and a control circuit board is provided above the driver IC. Thus, the control circuit board can be disposed so as to be within the step. As a result, the present invention has advantages in that it is not necessary to connect a control circuit board to a display panel, separately using a flexible printed circuit board, and that thickness and weight reduction of a display panel can be achieved.

According to another aspect of the present invention, the foregoing object is achieved through provision of a display device provided with a display panel including: a pair of first and a second substrates opposed to each other; an electrooptic material layer provided between the first and second substrates; a first extended area provided in one of adjacent margins of the display panel; a second extended area provided in the other margin; scanning electrodes formed on a surface of the first substrate which is opposed to the second substrate; signal electrodes formed on a surface of the second substrate which is opposed to the first substrate; a scanning driver integrated circuit connected to the scanning electrodes which is mounted on the first extended area, in which the first substrate extends further than an edge of the second substrate; and a data-signal driver integrated circuit connected to the signal electrodes which is mounted on the second extended area, in which the second substrate extends further than an edge of the first substrate; wherein a control circuit board is provided at least above the scanning driver integrated circuit mounted in the first extended area or the data-signal driver integrated circuit mounted in the second extended area so as to be substantially placed within the plane region of either extended area, and the input terminal portion of the scanning driver integrated circuit mounted in the first extended area and the input terminal portion of the data-signal driver integrated circuit mounted in the second extended area are connected to the output terminal portion of the control circuit board.

In the present invention based on this construction, by mounting a control circuit board above driver ICs mounted in a first extended area or a second extended area, the control circuit board can be connected to a display panel, separately using a flexible printed circuit board. Accordingly, weight reduction of a display device can be achieved. In particular, the present invention has an advantage in that thickness reduction of a display device can be achieved by disposing driver ICs and a control circuit board on a step in a first extended area or a second extended area. Moreover, according to the present invention based on the above-described construction, one control circuit board can output drive-control signals to both a scanning driver IC and a data-signal driver IC, whereby a terminal connection process can be simplified. Preferably, the input terminal portion of the driver integrated circuit above which the control circuit board is mounted is connected to an end of an input wiring portion formed on the extended area in which the driver integrated circuit is mounted, and another end of the input wiring portion, connected to the control circuit board, extends in the vicinity of the shorter side of the extended area.

According to the present invention based on this construction, a control circuit board is connected to an input wiring portion in the vicinity of the shorter side of an extended area. The present invention has an advantage in that the control circuit board can easily be warped, and can easily be mounted on a driver IC while being connected to the input wiring portion formed in the extended area. It is preferable that the control circuit board have a circuit-wiring pattern formed on a flexible insulating-resin base and electronic components for controlling the driving of the display panel.

The present invention based on this construction has an advantage in that the control circuit board can easily be warped while being connected to the input wiring portion formed in the extended area.

It is preferable that the control circuit board be extended so as to be connected to an end of an input wiring portion formed close to the shorter side of the extended area which is adjacent to the extended area in which the control circuit board is mounted.

Accordingly, the present invention has an advantage in that a convenience of terminal junction can be improved.

It is preferable that the control circuit board have a multilayer structure having insulating layers provided among a plurality of wiring layers in which, among the layers, predetermined upper and lower wiring layers are connected by a through hole or a via hole.

The present invention based on this construction has an advantage in that, by connecting a plurality of wiring layers via a through hole or a via hole, the degree of wiring integration and mounting density can be improved.

It is preferable that the control circuit board include a flexible input wiring portion.

The present invention based on this construction has an advantage in that the control circuit board can easily be connected to an input portion for generating a control signal, which can improve a convenience of wiring connection.

It is preferable that the electrooptic material layer be a liquid-crystal layer.

This construction has advantages in that a liquid-crystal display device for use in a portable information terminal, etc., can be formed to be thin and that improvement in a convenience of terminal connection realizes a liquid-crystal display device in which a module process is facilitated.

It is preferable that the electrooptic material layer be an electroluminescent light-emitting layer including an electroluminescent material.

The present invention based on this construction has advantages in that thickness reduction of an EL display device can be achieved and that weight reduction can be achieved by performing high integration of a control circuit board.

According to a further aspect of the present invention, the foregoing object is achieved through provision of an electronic apparatus including: a display device provided with a display panel having an electrooptic material provided between a pair of substrates opposed to each other, the display panel having a driver integrated circuit mounted on an extended area in which an edge of one of the substrates extends further than an edge of the other substrate, the extended area provided in at least a margin of the display panel, wherein a control circuit board, provided above the driver integrated circuit almost within the extended area, is connected to the input terminal portion of the driver integrated circuit; and an input unit for inputting a signal to the display device; wherein the display device is accommodated in a casing.

The present invention based on this construction has an advantage in that thickness reduction of a display device for an electronic apparatus can be achieved, whereby thickness reduction of the entire electronic apparatus can be achieved. In addition, according to the present invention, a display panel includes a control circuit board integrated therewith, which provides an advantage in that a convenience of assembly is improved.

It is preferable that the control circuit board of the display device include a flexible input wiring portion for establishing connection to the input unit.

According to the present invention based on this construction, an input wiring portion for establishing connection to an input unit is included in the control circuit board. Thus, without a separate process of joining the input wiring portion, a convenience of assembly can be improved.

According to the present invention, the thickness of a display unit in an electronic apparatus can be reduced. This enables the electronic apparatus to be thin. In addition, the structure of a display panel in which a control circuit board is integrated improves the convenience of assembly.

DESCRIPTION OF THE PREFERRED EMBODIMENTS

The present invention is described below with reference to the accompanying drawings. FIGS. 1 to 6 show an active-matrix liquid-crystal display device 20 according to an embodiment of the present invention. The active-matrix liquid-crystal display device 20 uses, as switching devices, two-terminal non-linear devices such as thin film diodes (TFDs).

Figure 1:
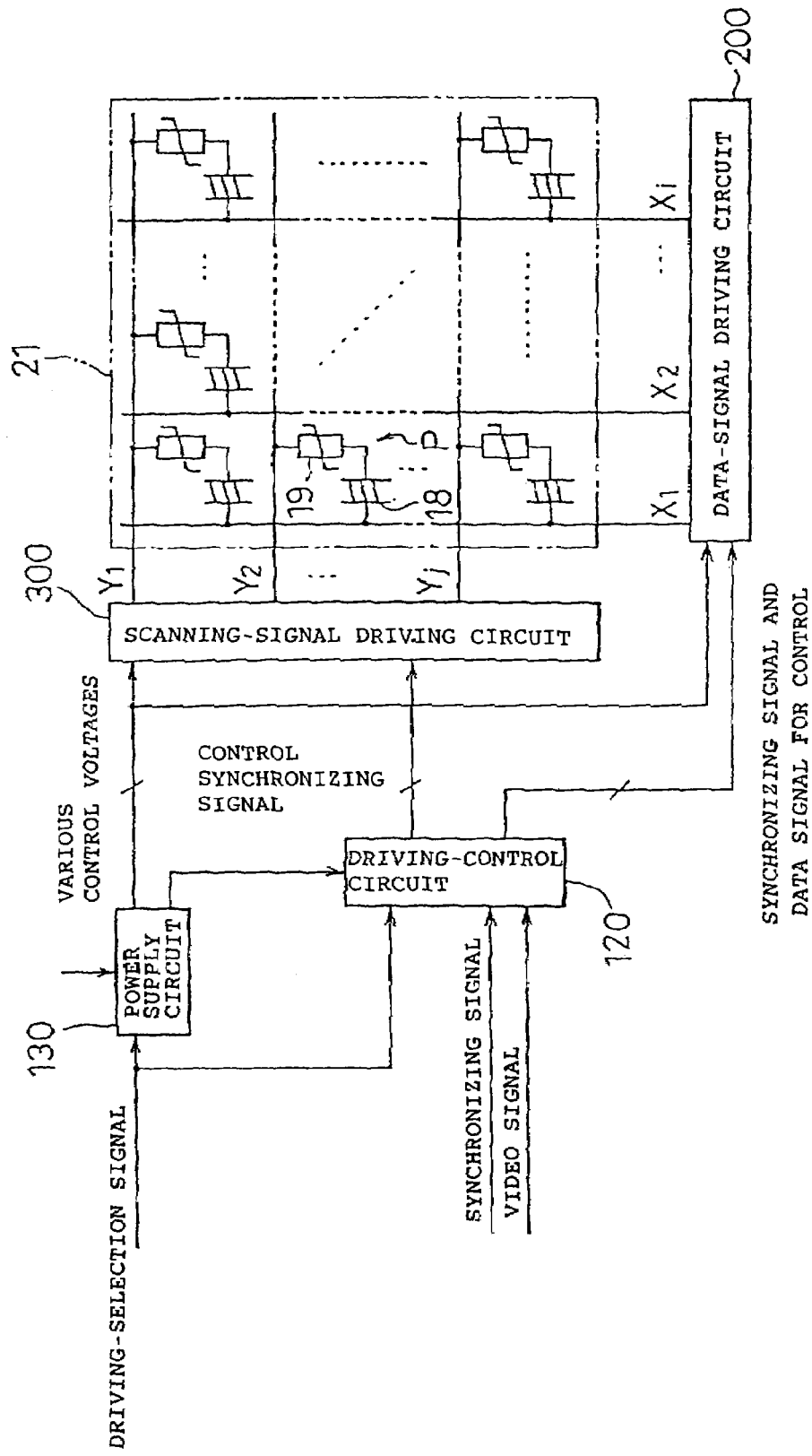
FIG. 1 is a block diagram showing the main components of a liquid-crystal display device according to an embodiment of the present invention.

FIG. 1 shows the main components of the liquid-crystal display device according to the embodiment of the present invention.

As shown in FIG. 1, a liquid-crystal display panel 21 has i data lines X1 to Xi, j scanning lines Y1 to Yj, and pixel regions P formed corresponding to the intersections of the data lines X1 to Xi and the scanning lines Y1 to Yj. The pixel regions P are formed by connecting a liquid crystal layer 18 and TFDs 19 in series. The scanning lines Y1 to Yj are identical to scanning lines 26 shown in FIG. 2.

The scanning lines Y1 to Yj are driven by a scanning-signal driving circuit 300, and the data lines X1 to Xi are driven by a data-signal driving circuit 200. The scanning-signal driving circuit 300 and the data-signal driving circuit 200 are controlled by a driving-control circuit 120.

The TFDs 19 are connected to the scanning lines Y1 to Yj, and the liquid crystal layer 18 is connected to each data line, as shown in FIG. 1. Conversely, the TFDs 19 may be connected to the data lines X1 to Xi, and the liquid crystal layer 18 may be connected to each scanning line.

The driving-control circuit 120 outputs, to the scanning-signal driving circuit 300, various control-use synchronizing signals for controlling the voltages of and supply timing for data signals and scanning signals, while it uses a synchronizing signal and a video signal to output, to the data-signal driving circuit 200, data signals, etc., having a predetermined format adapted for display data.

A power supply circuit 130 supplies each driving circuit with control voltages such as a predetermined high voltage, a predetermined low voltage, and a predetermined reference voltage.

In this embodiment, a control circuit board 22 (shown in FIG. 2) provided with the driving-control circuit 120 and the power supply circuit 130 is mounted on a driver IC, such as the data-signal driving circuit 200 or/and the scanning-signal driving circuit 300, on the liquid-crystal display panel 21.

The details of the components of the liquid-crystal display device 20 according to the embodiment are described below in order.

Figure 2:
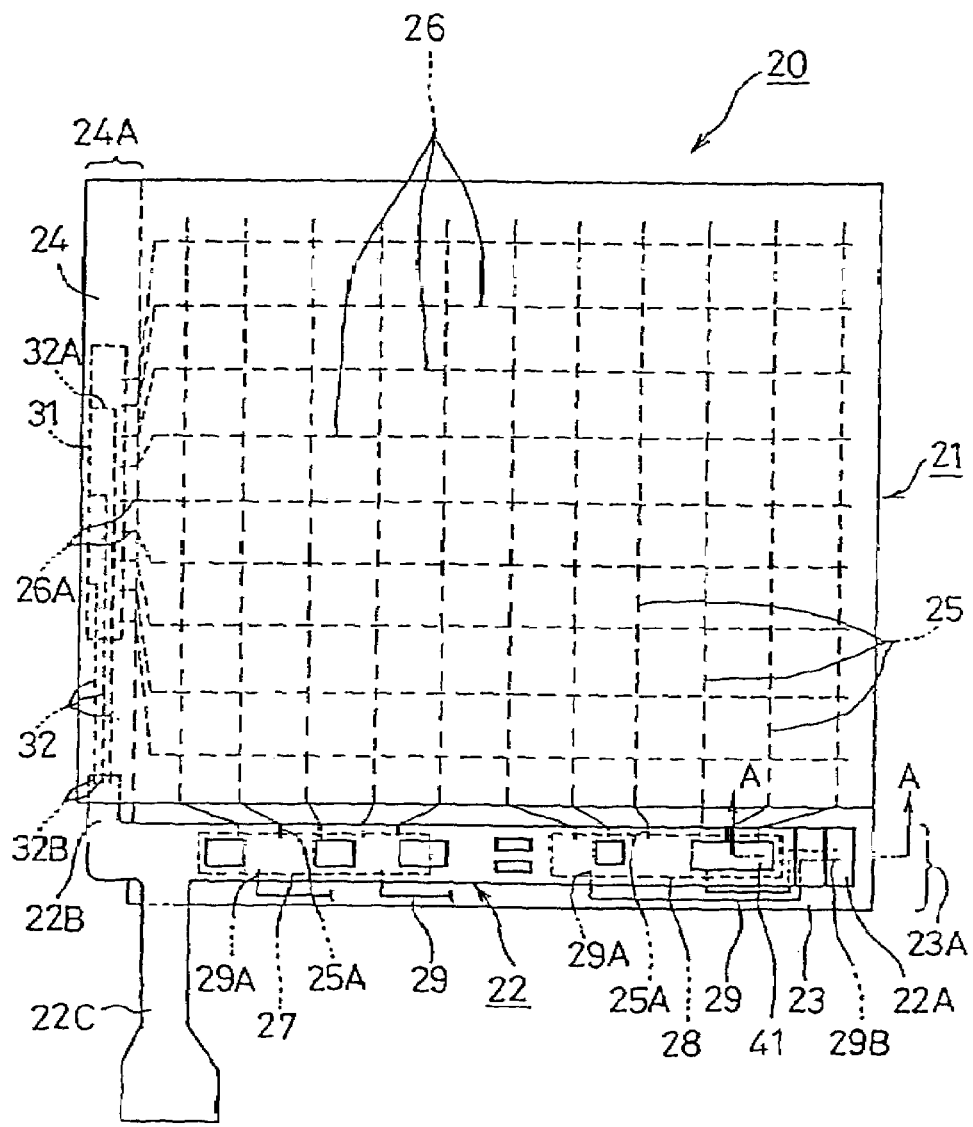
FIG. 2 is a plan view showing the liquid-crystal display device shown in FIG. 1.

The liquid-crystal display device 20 includes the liquid-crystal display panel 21 and the control circuit board 22 mounted thereon, as shown in FIG. 2.

Figure 3:
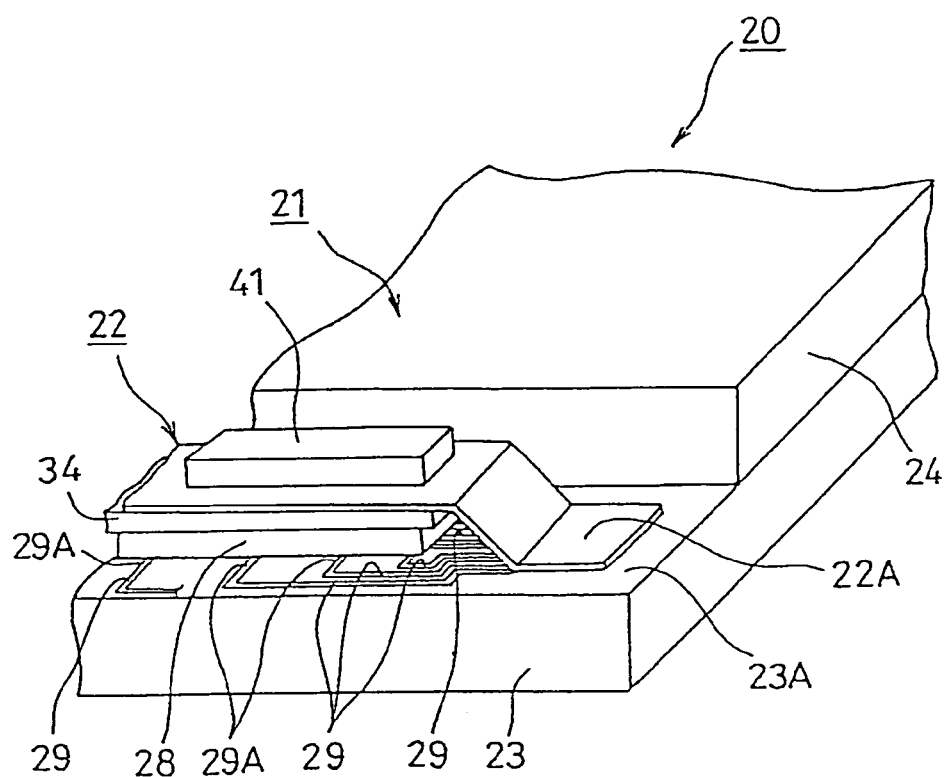
FIG. 3 is a perspective view showing the liquid-crystal display device shown in FIG. 1.

Referring to the structure of the liquid-crystal display panel 20, the liquid-crystal display panel 20 has a pair of glass substrates 23 and 24 opposed to each other, as shown in FIGS. 2 and 3. Between glass substrates 23 and 24, there is provided a sealing material (not shown) surrounding a display region. In a gap that is positioned between the glass substrates 23 and 24 and that is surrounded by the sealing material, liquid crystal (not shown) is sealed.

On the opposed internal surface of the glass substrate 23, which is opposed to the glass substrate 24, a plurality of data-signal electrodes 25 are formed in parallel with one another. The signal electrodes 25 are composed of a light-transmissive material such as indium tin oxide (ITO). The signal electrodes 25 are arranged at predetermined intervals along a predetermined direction (the vertical direction in FIG. 2 or X-direction).

On the opposed internal surface of the glass substrate 24, which is opposed to the glass substrate 23, the scanning electrodes 26 are formed perpendicularly to the data electrodes 25. The scanning electrodes 26 are composed of an electrically conductive material reflecting display light. The scanning electrodes 26 are arranged at predetermined intervals in parallel with one another. In other words, between the signal electrodes 25 formed on the glass substrate 23 and the scanning electrodes 26 formed on the glass substrate 24, the TFDs 19, the pixel electrodes, and the liquid crystal layer, shown in FIG. 1, are connected in series, whereby a so-called "X-Y matrix" of pixels is formed.

As shown in FIG. 2, in a predetermined margin (the lower side in FIG. 2) of the liquid-crystal display panel 21, an edge of the glass substrate 23 extends (the bottom in FIG. 2) further than an edge of the glass substrate 24. In a margin (the left side in FIG. 2) of the liquid-crystal display panel 21 which is adjacent to the predetermined margin, an edge of the glass substrate 24 extends (to the left in FIG. 2) further than an edge of the glass substrate 23.

Figure 4:
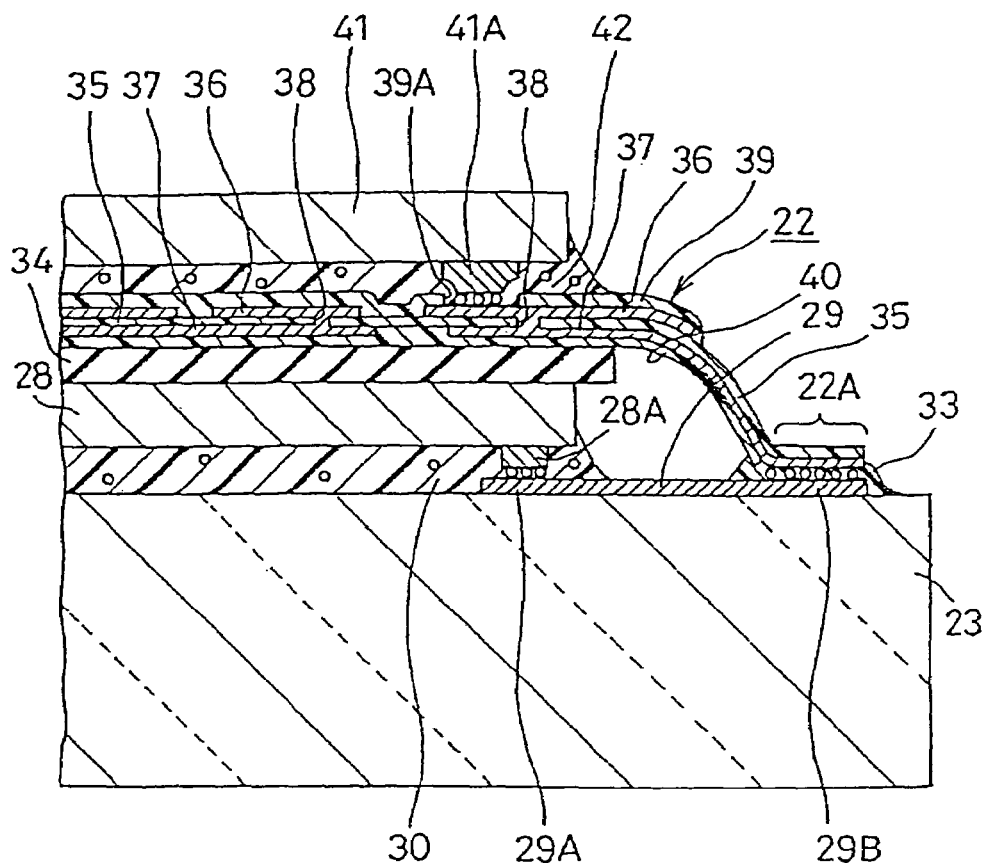
FIG. 4 is a sectional view taken in the line A—A of FIG. 2.

In an extended area 23A on the opposed internal surface of the glass substrate 23, data-signal driver ICs 27 and 28 are mounted by COG mounting. The data-signal driver ICs 27 and 28 are connected to output terminals 25A (shown in FIG. 2) formed by extending the signal electrodes 25 and to ends (input terminals) 29A of input lines 29 (shown in FIGS. 2 and 3). For the output terminals 25A and the ends 29A of the input lines 29, the data-signal driver ICs 27 and 28 are flip-chip mounted by face down bonding. FIG. 4 is a sectional view taken in the line A–A' shown in FIG. 2. FIG. 4 shows that a bump 28A provided to protrude on the lower surface of the data-signal driver IC 28 is bonded and connected to the ends 29A of the input lines for data signal 29 via an anisotropic conductive film (ACF) 30.

The input lines 29 are arranged as shown in FIGS. 2 and 3, and the other ends (output terminals) 29B of the input lines 29 are positioned vicinity of a shorter side of the extended area 23A, which is opposed to the extended area 24A in this embodiment. The other ends 29B of the input lines 29 are connected to the signal-output terminal portion 22A of the control circuit board 22 via the ACF 33, as shown in FIG. 4.

The control circuit board 22 is provided above the data-signal driver ICs 27 and 28, with an insulating material, such as an insulating substrate 34, provided between the control circuit board 22 and the data-signal driver ICs 27 and 28.

As shown in FIG. 2, in the extended area 24A on the opposed internal surface of the glass substrate 24, a scanning driver IC 31 is mounted by COG. The scanning driver IC 31 is flip-chip mounted by face-down bonding, and is connected to output terminals 26A formed by the extending scanning electrodes 26 and to ends (input terminals) 32A of input lines for scanning signal 32, similarly to the data-signal drivers ICs 27 and 28. In this embodiment, the input lines 32 extend into the vicinity of a shorter side of the glass substrate 24 which is the extended area 23A of the glass substrate 23. The other ends (output terminals) 32B of the input lines 32 extending into the vicinity of the shorter side of the glass substrate 24 are connected to the control circuit board 22.

The number of input terminals (the number of the input lines 29 and 32) of the data-signal driver ICs 27 and 28 and the scanning driver IC 31 is much smaller than the number of output terminals (the number of the signal electrodes 25 and the scanning electrodes 26). Accordingly, in this embodiment, even if terminals are formed and arranged along the shorter sides of the extended areas 23A and 24A, no problem occurs in that the arrangement area for the terminals is reduced.

The control circuit board 22 is provided with electronic components constituting portions of the driving control circuit 120 and the power supply circuit 130 shown in FIG. 1, and is flexible as a whole. As shown in FIG. 2, the control circuit board 22 is positioned to be almost within the extended area 23A of the glass substrate 23, when viewed two-dimensionally. At an end of the control circuit board 22 which is opposed to the signal-output terminal portion 22A, a scanning-output terminal portion 22B extending to the shorter side of the extended area 24A of the glass substrate 24 is formed to incorporate with the end of the control circuit board 22. The scanning-output terminal portion 22B is connected to the other ends (output terminals) 32B of the input lines 32 via an ACF (not shown). On the control circuit board 22, a control-signal input-line portion 22C for inputting control signals is formed to incorporate with the control circuit board 22.

The control circuit board 22 has predetermined-pattern-wiring portions 36 and 37 formed on the front and back surfaces of a base sheet 35. The wiring portions 36 and 37 are connected appropriately via a through hole (or via hole) 38, so that the control circuit is formed. The wiring portions 36 and 37 formed on the front and back surfaces of the base sheet 35 are coated with insulating coating films 39 and 40. An opening 39A is formed on the insulating coating film 39 so that the wiring portion 36 is exposed at a predetermined position. Electronic components are connected to the portion as a pad, of the wiring portion 36 which is exposed by the opening 39A. FIG. 4 shows that a power IC 41 constituting the power supply circuit 130 is connected to a bump 41A and the wiring portion 36 via an ACF 42 by means of face-down bonding.

The signal-output terminal portion 22A, the scanning-output terminal portion 22B, and the control-signal input-line portion 22C, which are on the control circuit board 22, are extensions of the base sheet 35 on which wiring patterns are formed suitably.

The above-described control circuit board 22 is positioned above the data-signal driver ICs 27 and 28, with the insulating substrate 34 provided between the control circuit board 22 and the driver ICs 27 and 28. The control circuit board 22 may be fixed to the driver ICs 27 and 28. The insulating substrate 34 prevents the control circuit board 22 from bending when the control circuit board 22 is mounted on the insulating substrate 34. However, in the case where the control circuit board 22 has predetermined hardness, the use of the insulating substrate 34 may be omitted.

The active-matrix liquid-crystal display device 20 according to this embodiment uses a difference in level formed by the glass substrates 23 and 24. In particular, when the control circuit board 22 is mounted on the data-signal driver ICs 27 and 28, it is preferable that the sum of the heights of the data-signal driver ICs 27 and 28, the control circuit board 22, and the insulating substrate 34, is smaller than the thickness of the glass substrate 24 so that the top of the control circuit board 22 cannot be higher than the external surface of the glass substrate 24. However, even when the top of the control circuit board 22 is higher than the external surface of the glass substrate 24, an advantage can be obtained in which the thickness of the liquid-crystal display device 20 is greatly reduced, compared with the case where a printed-circuit board having mounted electronic components is used.

Figure 5:
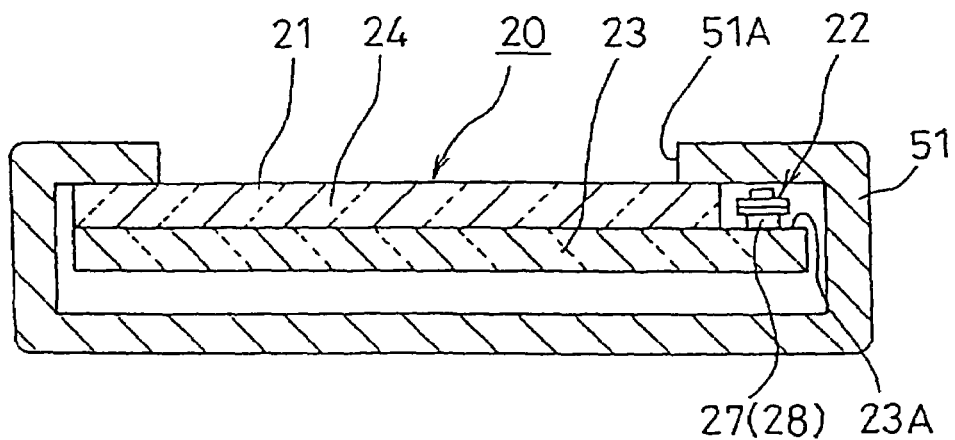
FIG. 5 is a sectional view showing that the liquid-crystal display device (shown in FIG. 1) in a casing.

FIG. 5 is a sectional view showing that the above-described liquid-crystal display device 20 is accommodated in a casing 51. In this embodiment, by providing the control circuit board 22 above the data-signal driver ICs 27 and 28 on the extended area 23A (in the opposed internal surface) of the glass substrate 23, the thickness of the liquid-crystal display device 20 can be reduced, and also the thickness of the casing 51 can be reduced.

Figure 6:
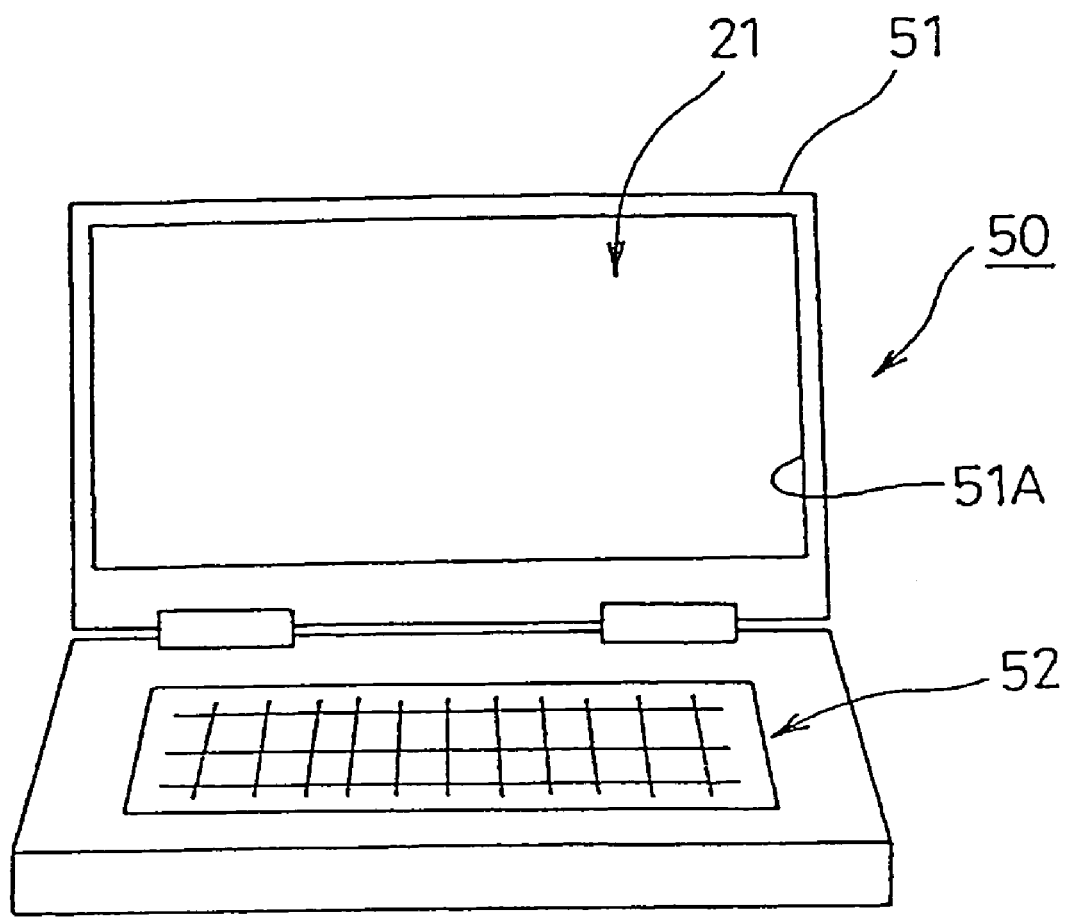
FIG. 6 is a perspective view showing an electronic apparatus according to an embodiment of the present invention.
Figure 7:
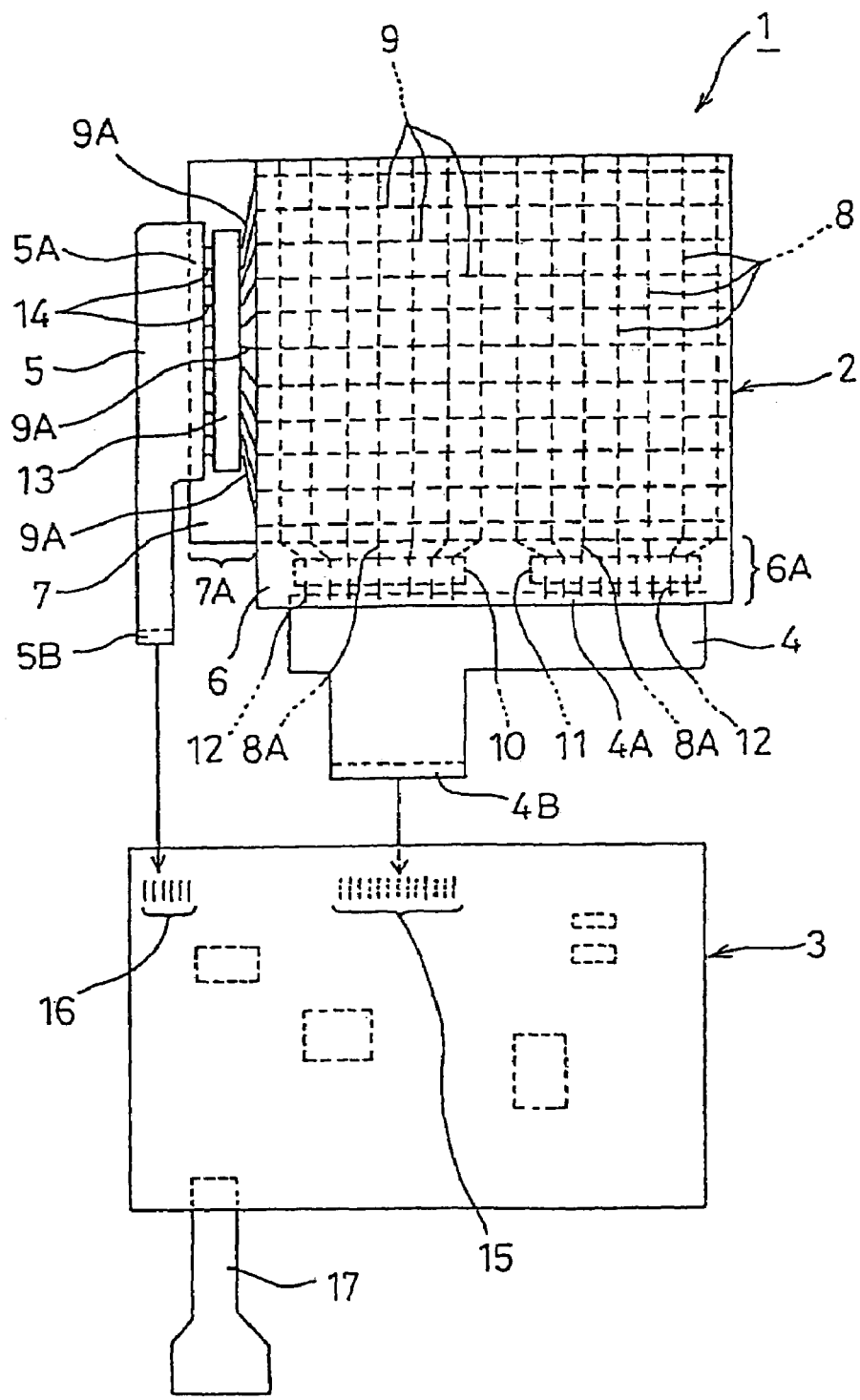
FIG. 7 is a plan view showing a conventional liquid-crystal display device.
Figure 8:
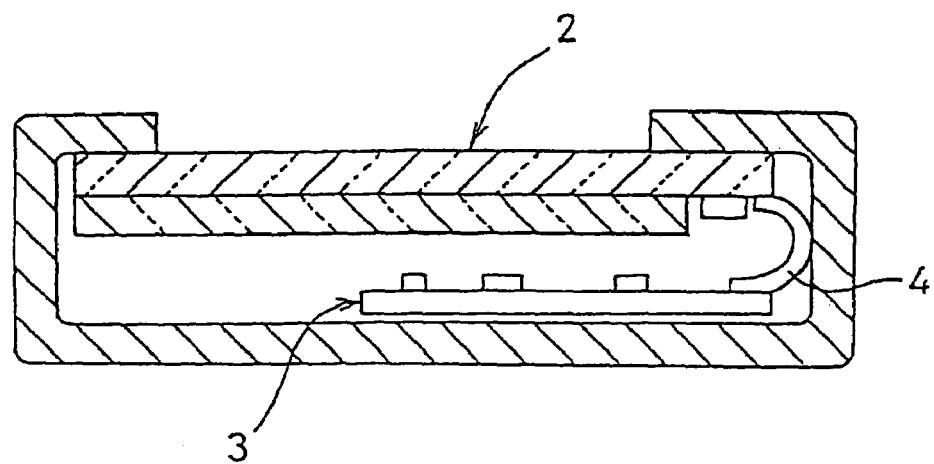
FIG. 8 is a sectional view showing the conventional liquid-crystal display device shown in FIG. 7.

Referring to FIG. 6, the structure of a notebook personal computer 50 (as an electronic apparatus) using the liquid-crystal display device 20 as a display unit is described below. As shown in FIG. 6, the liquid-crystal display panel 21 is accommodated in the casing 51, and the display region of the liquid-crystal display panel 21 is exposed from an opening 51A formed in the casing 51. The personal computer 50 is provided with a key board 52 as an input device. As described above, the display unit of the personal computer 50 can be reduced in thickness, which reduces the thickness of the casing 51. Accordingly, the thickness and weight of the personal computer 50 can be reduced. In addition, a control-signal input-line portion 22C (not shown in FIG. 6) is incorporated in the control circuit board 22. This improves the convenience of connecting the personal computer 50 to the input device (key board 52), without using wiring means such as a flexible printed-circuit board. Therefore, the present invention realizes thickness reduction and size reduction in various electronic apparatuses other than the personal computer 50, such as pagers, liquid-crystal television receivers, viewfinders, car navigation systems, electronic pocketbooks, word processors, cellular phones, and television telephones.

Although the present invention has been described using the foregoing embodiments, a display device and an electronic apparatus according to the present invention are not limited to the foregoing embodiment, but may be modified within the sprit and scope of the present invention. In the foregoing embodiments, the present invention is applied to, as a display device, an active-matrix liquid-crystal display device having a TFD at each pixel electrode. However, the present invention may be applied to an active-matrix liquid-crystal display device using thin film transistors and to a passive-matrix liquid-crystal display device. These liquid-crystal display devices are not limited to a reflective type, but a transmissive type or transflective type may be used. In addition, the present invention may be applied to an electroluminescent display device. In the electroluminescent display device, an electroluminescent material including a luminescence material is used as an electrooptic material, and the arrangement of scanning electrodes and signal electrodes can be formed substantially similar to that of element substrate of the conventional TFT (Thin Film Transistor) liquid-crystal display device.

Although the control circuit board 22 is provided in the extended area 23A of the glass substrate 23 in the foregoing embodiments, it may be provided in the extended area 24A of the glass substrate 24. Otherwise, control circuit boards for separately performing the function of the control circuit board 22 may be provided in both extended areas 23A and 24A. The control circuit board 22 may have flexibility in only the vicinity of each connection terminal portion for establishing connection. A wiring pattern formed on the control circuit board 22 may have a multilayer structure as described in the foregoing embodiments or a single layer structure.

Although the glass substrates 23 and 24 are used as panel substrates, the panel substrates are not limited to glass, but may be composed of such a material as synthetic resin.

What is claimed is:

1. A display device comprising:
    a first glass substrate;
    a second glass substrate opposing the first glass substrate, the second glass substrate including an extended area that projects in an extension direction beyond a peripheral edge of the first glass substrate, the extended area having short sides aligned with the extension direction;
    an electrooptic material layer interposed between the substrates;
    an input line disposed on the extended area of the second glass substrate;
    a data signal driver integrated circuit mechanically fixed directly to the second glass substrate via a medium at a mounting position on the extended portion, the data signal driver integrated circuit having a bump electrically connected to the input line; and
    a flexible circuit board substantially accommodated within the extended portion in plan view and mounted with an electronic component that overlaps the data signal driver integrated circuit in plan view, the flexible circuit board having an opposing side that at least partially opposes the data signal driver integrated circuit and a signal output terminal provided adjacent an edge of the opposing side, the signal output terminal being electrically connected to the input line at a position of the extended area between one of the short sides of the extended area and the mounting position of the data signal driver integrated circuit.

2. A display device according to claim 1, wherein a wiring is formed on the opposing side of the flexible circuit board, the wiring being electrically connected to the input line through the signal output terminal, and the signal output terminal being electrically connected to the data signal driver integrated circuit through the input line.

3. A display device according to claim 1, wherein the circuit board has a multi-layer structure with a plurality of wiring layers and at least one insulating layer between the wiring layers, the wiring layers being electrically connected to each other through the at least one insulating layer by at least one of a through hole and a via hole.

4. A display device according to claim 1, wherein the circuit board includes a wiring portion formed with wiring for inputting signals to the circuit board.

5. A display device according to claim 1, wherein the electrooptic material layer includes a liquid crystal layer.

6. A display device according to claim 1, wherein the electrooptic material layer includes an electroluminescent light-emitting layer including an electroluminescent material.

7. A display device comprising:
    a first glass substrate and a second glass substrate opposing each other, the first glass substrate including a first extended area that projects beyond a peripheral edge of the second glass substrate, the second glass substrate including a second extended area that projects beyond a peripheral edge of the first glass substrate, the second extended area having short sides extending in the direction in which the second extending area extends beyond the first glass substrate;
    an electrooptic material layer interposed between the substrate;
    a scanning line formed over a surface of the first glass substrate that opposes the second glass substrate;
    a data signal line formed over a surface of the second glass substrate that opposes the first glass substrate;
    a scanning driver integrated circuit mechanically fixed directly to the first glass substrate via a medium at a mounting position on the first extended portion, the scanning signal driver integrated circuit having a bump electrically connected to the scanning line;
    a data signal driver integrated circuit mechanically fixed directly to the second glass substrate via a medium at a mounting position on the second extended portion, the data signal driver integrated circuit having a bump electrically connected to the data signal line;

an input line disposed on the second extended area of the second glass substrate;

a flexible circuit board substantially accommodated within the second extended portion in plan view and mounted with an electronic component that overlaps the data signal driver integrated circuit in plan view, the flexible circuit board having a signal output terminal adjacent one lengthwise edge and a scanning output terminal adjacent the opposite lengthwise edge, the flexible circuit board having an opposing side that at least partially opposes the data signal driver integrated circuit, the signal output terminal being provided at the opposing side, the signal output terminal being electrically connected to the input line at a position of the second extended area between one of the short sides of the second extended area and the mounting position of the data signal driver integrated circuit, the scanning output terminal being electrically connected to the scanning driver integrated circuit.

8. A display device comprising:

a first glass substrate;

a second glass substrate opposing the first glass substrate, the second glass substrate including an extended area that projects beyond a peripheral edge of the first glass substrate;

an electrooptic material layer interposed between the substrates;

an input line disposed on the extended area of the second glass substrate;

an integrated circuit mechanically fixed to the second glass substrate on the extended portion, the integrated circuit having a bump electrically connected to the input line; and a flexible circuit board disposed on the opposite side of the integrated circuit from the second glass substrate and electrically connected to the integrated circuit;

an electronic component mounted on the flexible circuit board at a position that overlaps the integrated circuit in plan view; and an insulating substrate interposed between the integrated circuit and the flexible circuit board;

wherein one end of the input line is connected to the bump of the integrated circuit and the other end of the input line is connected to a terminal on the flexible circuit board.

9. A display device according to claim 8, wherein the other end of the input line and the terminal of the flexible circuit board are connected together at a position between a short edge of the extended area and the integrated circuit.

10. A display device according to claim 9, wherein the circuit board has a multi-layer structure with a plurality of wiring layers and at least one insulating layer between the wiring layers, the wiring layers being electrically connected to each other through the at least one insulating layer by at least one of a through hole and a via hole.

* * * * *